United States Patent [19]
Kuo

[11] Patent Number: 4,918,328
[45] Date of Patent: Apr. 17, 1990

[54] APPARATUS AND METHOD FOR GENERATING A STEP VOLTAGE WAVEFORM

[75] Inventor: Feng Kuo, Purdys, N.Y.

[73] Assignee: Hypres Incorporated, Elmsford, N.Y.

[21] Appl. No.: 190,955

[22] Filed: May 3, 1988

[51] Int. Cl.$^4$ .................... H03K 4/02; H03K 3/315; H03K 3/38
[52] U.S. Cl. .................... 307/227; 307/260; 307/277; 307/286; 307/306; 307/322; 505/864
[58] Field of Search .............. 307/476, 277, 462, 478, 307/286, 306, 322, 260, 227; 357/5; 505/863, 864, 865

[56] References Cited

U.S. PATENT DOCUMENTS

| | | | |
|---|---|---|---|
| 3,119,936 | 1/1964 | Bergman | 307/286 |
| 4,413,196 | 11/1983 | Josephs et al. | 307/462 |
| 4,555,643 | 11/1985 | Kotera et al. | 307/476 |
| 4,570,087 | 2/1986 | Matheron et al. | 307/462 |

FOREIGN PATENT DOCUMENTS

| | | | |
|---|---|---|---|
| 0197916 | 12/1982 | Japan | 307/306 |
| 0103224 | 6/1983 | Japan | 307/306 |
| 0124327 | 7/1983 | Japan | 307/306 |
| 0124328 | 7/1983 | Japan | 307/306 |
| 0124330 | 7/1983 | Japan | 307/306 |
| 0038927 | 2/1985 | Japan | 307/306 |

OTHER PUBLICATIONS

Bergman, "Bistable Self-Resetting Tunnel Diode Amplifier", RCA, technical notes, No. 500, Sep. 1961, p. 120302.
Faris, "Electronically Variable Cryogenic Delay Generator", IBM, vol. 26, No. 3B, Aug. 1983, p. 1330.
"The First Commercial Ultra-Wide Bandwidth Instrument Product Based on Josephson Junctions", by Hanson et al.
"Technologies for Josephson Junction Picosecond Sampling Oscilloscope/Time Domain Reflectometer", by Whiteley et al.

*Primary Examiner*—John Zazworsky
*Attorney, Agent, or Firm*—Kenyon & Kenyon

[57] ABSTRACT

In a time domain reflectometer a first step generator may include two branches of elements which are current sensitive and will produce a gap voltage if the current exceeds a specific threshold. Each branch may include either Josephson junction devices or tunnel diodes. When a trigger signal plus a bias current exceed a threshold value a first one of the elements in a first branch produces a gap voltage and diverts current to the second branch. The current causes all of the elements in the second branch to produce gap voltages and the current is diverted back to the first branch to switch the states of the remaining elements of the first branch. Once all of the elements in both branches produce gap voltages, the total signal produced by these elements is transmitted to a third output branch. The circuit produces a fast step signal and lends itself to expansibility whereby the amplitude of the step signal can be varied by varying the number of elements in the branches of the circuit.

7 Claims, 1 Drawing Sheet

APPARATUS AND METHOD FOR GENERATING A STEP VOLTAGE WAVEFORM

BACKGROUND OF THE INVENTION

The present invention relates to the field of electrical testing and measurement, including the use of a sampling oscilloscope and a time domain reflectometer. In particular, this invention relates to an apparatus and method for generating a fast step voltage waveform that is, a step voltage waveform having a low rise time.

A time domain reflectometer ("TDR") is an instrument designed to indicate and to measure reflection characteristics of a transmission system connected to the instrument. A TDR consists of four basic components: (1) a step generator (acting as a signal source), (2) a strobe pulse generator, (3) a sampling device, and (4) a variable delay generator. The TDR produces a step signal and sends it to a system under test. The TDR monitors the step-signals entering the system under test and any reflected transient signals. These signals are displayed on the step-signals on an oscilloscope equipped with a suitable time-base sweep.

As stated above, in a TDR, a step signal is sent to a circuit under test. If there is an impedance mismatch, a signal will be reflected back, and the TDR circuitry will check the reflected signal to determine what type of device is being tested. By measuring a reflection time of the returned signal, defined as the time between a step signal transmission and the receipt of a reflection, one can tell where an impedance mismatch occurs and the extent of the impedance mismatch. This information is derived form a reflection ratio and the reflection time. The reflection ratio is related to the impedance of the device tested and the standardized output impedance of the TDR.

The incident step is generated by a step generator and sent through a transmission line to a connector, and ultimately to the circuit under test. If there is a perfect impedance match there will be no reflection. A display on the TDR will show any reflection of the step signal superimposed on the incident step. If there is a capacitive or inductive mismatch, the reflected signal will have a characteristic shape such as to allow determination of the reactive parameters of the mismatch. A TDR circuit can either display transmission current or voltage at the back termination, the difference being in the displayed polarity of the reflections with respect to the generated step signal.

In a TDR, the lower the risetime of the step generated by the step generator, the more information is sent back from the device being tested since a lower risetime step has more high frequency energy. The lower rise time means that it takes a very short time for the signal to change from its low state to its high state, that is to "step up" to the higher state.

Existing fast and super-fast step generators have employed Josephson junctions and drivers which utilize a single parallel magnetic control line. A fast or super fast step generator can be considered to be a step generator having a rise-time of less than 10 picoseconds. Josephson junction devices utilize the principles of superconductivity, tunneling, and Josephson effects. Superconductivity manifests itself as zero electrical resistance. In order to utilize those principles the devices must be operated at very low temperatures thereby guaranteeing the superconductive properties desired.

A Josephson junction has a current-voltage characteristic similar to that of a tunnel diode. Both the Josephson junction and the tunnel diode have a critical current at which point there is a sudden transition to a gap voltage, also known as the "voltage state." Beyond the gap voltage or voltage state, current rises with increasing voltage. Both the Josephson junction and the tunnel diode current-voltage characteristics display hysteresis for the forward and return paths in a plot of those characteristics.

In the Josephson junction, below the critical current the junction performs as a zero resistance line. At the critical current the junction becomes resistive and current flowing through the junction produces a gap voltage across the junction.

In a tunnel diode there is an operation region according to its I/V (current/voltage) characteristic curve where there is instability, known as a negative resistance region. At the critical current the voltage across the diode increases by an amount denoted the gap voltages. Above this critical current the diode operates in a resistive fashion.

For a niobium Josephson Junction, the voltage state (i.e., the gap voltage) is typically 2.8 mV, however a 2.8 mV step is too small for a practical step in a TDR. In order to increase the size of the step (the amplitude of the step) a plurality of Josephson junctions or tunnel diodes can be connected in series. Problems may be encountered in connecting Josephson junctions or tunnel diodes in series. There has been no way to assure that all of the Josephson junctions or tunnel diodes will have exactly the same critical current ("$I_c$"). That is, there has been no way to assure that all of the Josephson junctions or tunnel diodes in a given series connection will switch at the same time. If the Josephson. junctions or tunnel diodes do not switch at the same time, a signal produced by the series connection will not be a perfect step. Instead, the signal will be a collection of small steps which will produce an imperfect step.

An example of an existing circuit for producing a step is illustrated in "A Superconducting Josephson Junction Time Domain Reflectometer with Room Temperature Access", S. R. Whiteley, GKG Hohenwarter, and S.M. Faris IEEE Trans. Mag. March 1987 (Proc. Applied Superconducivitity Conf. Baltimore 1986). The circuit includes a drive circuit structure and a step generator that includes a series of Josephson junctions. The drive circuit provides a quick rising current that is transferred to the step generator which is coupled to the drive circuit by a resistance and an inductance.

There are a number of problems with this circuit. First, it requires very tight matching of critical currents or poor switching will result. Second, it requires complex drive circuitry. Both of these factors reduce yield. The probabilistic distribution of critical currents limits expandability and reduces operation margins. Third, the circuit requires insulated magnetic control lines, thus additional insulator and superconductor layers are necessary in processing.

In addition, the circuitry does not have good expansibility. More expansibility, that is the ability to add junctions to the circuitry would result in more amplitude in the output. In other steps generators the circuitry will possibly encounter more difficulties if more junctions are added to that circuitry.

In short, the existing step generator circuitry is sensitive to the imbalance of the driver structure, which results in poor switching, narrow operating margins, and variations of the step wave form obtained.

SUMMARY AND OBJECTS OF THE INVENTION

In view of the above background, one of the objects of the present invention is to provide an apparatus and a method of generating a fast step waveform.

Another object of the present invention is to provide an apparatus for generating a voltage step waveform where the circuitry is less complex and the generation of the waveform is more easily implemented than in a previous step generators using Josephson junctions.

Another object of the present invention is to provide an apparatus for generating a step voltage waveform that can be easily triggered and does not require a fast, large trigger pulse.

A further object of the present invention is to provide an apparatus for generating a step voltage waveform in which the input is isolated from the output.

Another object of the present invention is to provide an apparatus for generating a step voltage waveform that is less sensitive to differences in switching characteristics between junctions provided in series, has a wider, more consistent operating margin, and can accept more process variations than can prior step generators.

A further object of the present invention is to provide an apparatus for generating a step voltage waveform that can be easily expanded to generate any voltage step that is the multiple of a single junction gap voltage without much modification of the basic structure.

Another object of the present invention is to provide an apparatus for generating a step voltage waveform that is less complicated to lay out on a substrate.

Another object of the present invention is to provide an apparatus for generating a step voltage waveform that has better yield than existing step generators.

These and other objects are achieved by the present invention. The present invention may generally be summarized as an apparatus for generating a step voltage waveform comprising: An apparatus for generating a step voltage waveform, comprising:

first means for receiving a switching signal;

second means responsive to said switching signal for producing an intermediate signal switchable between at least a first voltage and a second voltage, said second means including a first path comprising a first plurality of switching devices in series coupled to a second path comprising a second plurality of switching devices in series; and third means responsive to the switching of the intermediate signal from the said first voltage to the said second voltage for providing a fast step voltage waveform as an output signal said third means including a third path of a third plurality of switching devices in series.

Another aspect of the present invention is a method for generating a step voltage, comprising the steps of:

applying a trigger signal to an input of a driver circuit including a first path comprising a first plurality of switching devices in series, coupled to a second path comprising a second plurality of switching devices in series;

switching each of said first and second pluralities of switching devices from a first state to a second state in response to said trigger signal;

producing an intermediate signal in response to the switching of said devices from said first state to said second state;

applying said intermediate signal to an output circuit; and providing a fast step voltage waveform at an output of said output circuit in response to said intermediate signal. Other objects, features, and advantages of the present invention will be apparent from the accompanying drawings and from the detailed description which follows below.

BRIEF DESCRIPTION OF THE DRAWINGS

The present invention is illustrated by way of example and not limitation in the figures of the accompanying drawings, in which like references indicate similar elements, and in which.

DETAILED DESCRIPTION

Figure 1:
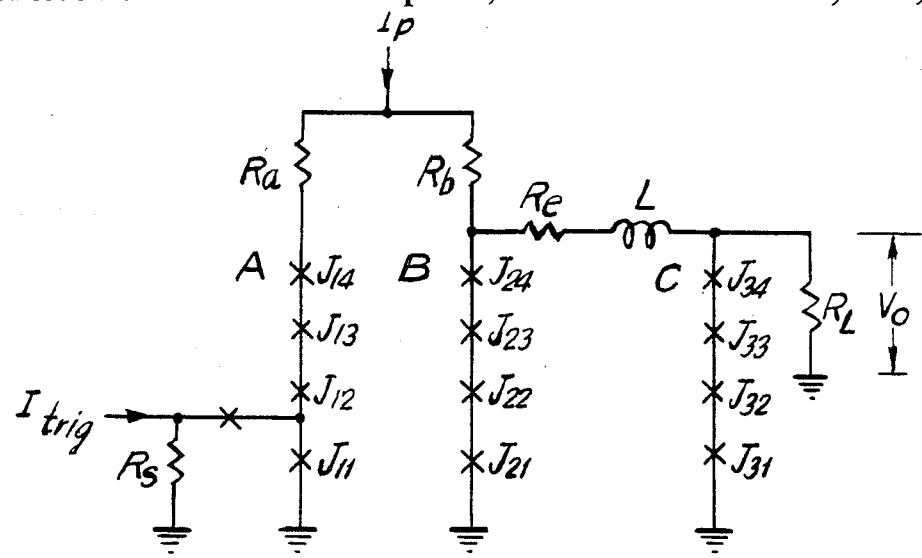
FIG. 1 is a circuit diagram of an embodiment of an apparatus for generating a step voltage waveform.

With reference to the drawings, FIG. 1 illustrates a circuit diagram of an apparatus for generating a step voltage waveform. The device labeled with a "J" are Josephson junction devices.

A drive circuit comprises Josephson junction $J_{14}$, $J_{13}$, $J_{12}$, $J_{11}$, connected together in series with a resistor $R_a$ to form Branch A. The drive circuit also includes Josephson junctions $J_{24}$, $J_{23}$, $J_{22}$, and $J_{21}$, connected together in series with a resistor $R_b$ to form Branch B. A trigger circuit is comprised of a Josephson junction $J_k$ and a resistor $R_s$. An output step generator comprises Josephson junction $J_{34}$, $J_{33}$, $J_{32}$, and $J_{31}$. An output of the output step generator is connected to a load resistor $R_L$. A resistor $R_e$ and an inductor L connect the drive circuit to the output step generator.

In one embodiment, the resistance of resistor $R_a$ is substantially the same as the resistance of resistor $R_b$. In addition, in a quiescent state the junctions each have a resistance of approximately zero. Therefore both branches have the same overall resistance.

At the quiescent state of this embodiment, a supply current $I_p$ is distributed evenly to both Branch A and Branch B of the drive circuit, because both branches have the same overall resistance. The condition $I_p < 2I_{c2}$ has to be satisfied so that all junctions will stay in the superconducting state. $I_{c2}$ is the lowest critical current of any of the Josephson junctions in series in branches A or B.

In an alternative embodiment of the present invention, the resistance of resistor $R_a$ is made different from the resistance of resistor $R_b$ in order to vary the margin of the step generator circuitry. When the ratio $R_a$ and $R_b$ is in a one to two ratio, then the critical current of the junctions in the respective branches has to be in a two to one ratio.

In the embodiment in which $R_a$ and $R_b$ are substantially equal, the critical currents are equal. As an input current $I_{trig}$ exceeds $I_{c2}-I_p/2$, thereby exceeding the critical current of junction $J_{11}$, the junction switches into the voltage state. Input current $I_{trig}$ does not have to be a short trigger pulse, but for good timing, $I_{trig}$ should be reasonably fast, i.e., of subnanosecond order.

Once junction $J_{11}$ is in the voltage state, then $J_{11}$ has a finite resistance of approximately 30 ohms.

The switching of junction $J_{11}$ into the voltage state initiates chain reactions between junctions that results in a final outgoing step. After junction $J_{11}$ is switched, all of supply current $I_p$ is diverted into the second branch of the driver, i.e., branch B. If current $I_p$ is greater than current $I_{c2}$, then all of the junctions $J_{2X}$ (X equals 1, 2, 3, and 4) in branch B will switch successively to the voltage state. The switching of the junctions $J_{2X}$ in branch B to the voltage state (i.e., the gap voltage) diverts current $I_p$ back to the first branch, i.e., branch A. The diverted current switches junction $J_k$ and junctions $J_{1X}$ (X equals 2, 3, and 4) to the voltage state. The switching of $J_k$ provides two major functions: (a) it diverts $I_{trig}$ through $R_s$, a low resistance, to ground thereby providing isolation of the step output from the input current $I_{trig}$, and (b) maintains a full gap voltage across $J_{11}$.

As the voltage drop across the driver circuitry reaches towards its full amplitude, the supply current $I_p$ is gradually redirected to the junction array $J_{3X}$ (X equals 1, 2, 3, and 4) and the inductor L is charging up at the same time. Inductor L slows down the current through resistor $R_e$ to make sure that all of the Branch A and Branch B junctions switch to a voltage state. A large inductor L will slow down the current flowing through resistor $R_e$, given that the inductor L will appear as a high impedance to a fast step. In the preferred embodiment, inductor L is approximately 100 picohenrys and a resistor $R_e$ is approximately 0.2 ohms. In an alternative embodiment, inductor L can be larger, but it cannot be much smaller than 100 picohenries. The value of resistor $R_e$ is not as critical as the value of inductor L. Resistors $R_a$ and $R_b$ are approximately one ohm each. The critical current for the junctions of the two branches is approximately one milliamp. Resistor $R_s$ is approximately 0.1 ohms.

By the time the current that is diverted to Branch C reaches the level of $I_{c3}$, the critical current for the junction array $J_{3X}$, a substantial voltage has been developed across the driver, so that the junctions of junction array $J_{3X}$ can easily switch to the gap voltage all together, nearly simultaneously thereby producing a fast and clean step waveform. The waveform is a fast step in that it has a rise-time of less than 10 picoseconds, preferably in the range of 3 to 8 picoseconds and usually 5 picoseconds. The energy stored in inductor L helps settle down the whole circuit at the final stage and helps maintain a flat top portion of the step waveform.

Voltage $V_O$ is the voltage developed across load resistor $R_1$ by the drive circuit and output step generator. The circuitry of FIG. 1 should develop a $V_o$ of approximately 0.01 volts.

Figure 2:
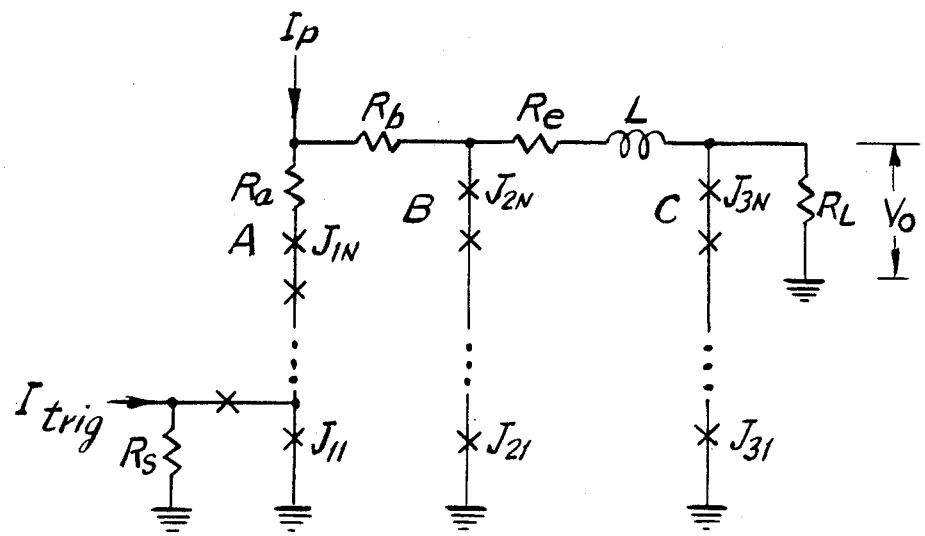
FIG. 2 is a circuit diagram of an alternative embodiment of an apparatus for generating a step voltage waveform.

FIG. 2 illustrates the theoretical expansibility of an apparatus of the present invention generating a step voltage waveform. Varying the number of junctions used in all of the branches of the circuitry, keeping the number of junctions in each branch equal will vary the amplitude of the output voltage $V_O$. As discussed above, and as FIG. 2 illustrates, the circuit of FIG. 2 can easily be expanded to generate any voltage step that is the multiple of the single junction gap voltage without much modification of the basic structure of FIG. 1.

As illustrated in FIG. 2, variable numbers of junctions can be coupled in series in branches A, B, and C. For example, three junctions could be coupled in branches A, B, or C. Moreover, five junctions could be coupled in series in branches A, B, or C.

A theoretical limit to the number of junctions placed in series in any particular branch exists due to the fact that signals start to reflect back for long paths of switching devices. These are transmission line effects. For example, if a length of one millimeter is the limit for the length of a branch of junctions before reflection problems develop, one can only fit so many junctions within that one millimeter branch length. A limiting factor on the number of junctions which can be used in a given branch length is that one can only make Josephson junctions so small before they become unreliable. If there is one defective Josephson junction in a series of junctions, the defective junction could render the entire circuit of junctions inoperable.

In an alternative embodiment of the present invention, the output voltage from the apparatus for generating a step voltage could be made to be a pulse rather than a step.

In another embodiment of the present invention, the circuit of FIG. 1 could be used as an output buffer to provide necessary amplifications for a single gap voltage of 2.8 millivolts to several times more for any possible interface needs.

In a further alternative embodiment of the present invention, the circuitry of FIG. 1 could be used as part of an OR gate. In such a configuration, one or more additional trigger signal lines would be added to the configuration illustrated in FIG. 1. The additional trigger signals can be transmitted through additional circuitry similar to the $R_S$, $J_K$ configuration of the illustrated embodiments and this circuitry can be coupled to the same node. A sufficient trigger signal from any one of these additional circuits would result in a step signal being produced by the output step generator.

Niobium nitride (NBN) has a critical temperature higher than that of niobium. Therefore, the gap voltage (i.e., the voltage state) of a NBN Josephson devices is higher than the gap voltage of a niobium Josephson device. In particular, the gap voltage of a NBN device is approximately five millivolts, although the gap voltage of a niobium device is approximately 2.8 millivolts. Therefore, the use of NBN Josephson devices in the circuitry of FIG. 1 would yield a higher step voltage $V_O$ than would the use of the same number of niobium Josephson devices in that same circuitry of FIG. 1. In addition, given that NBN has a critical temperature higher than that of niobium, one could use closed cycle refrigeration (CCR) to cool the circuitry of FIG. 1, rather than using liquid helium.

The "margin" of the circuitry of FIGS. 1 and 2 is the difference between the total critical current $I_c$ of the junction devices in branches A and B and the smallest supply current $I_p$ that would allow the circuit to work. A wider margin is desirable, because a wider margin means greater tolerance from a supply current point of view and from a fabrication point of view.

The design of FIG. 1 is less sensitive to a mismatch between Josephson junctions. Simulation results show that the circuitry of FIG. 1 can tolerate at least a plus and minus 7% mismatch between junctions and still deliver a clean and sharp step waveform. Hence, the design of FIG. 1 can accept more process variation than prior designs. All of these factors translate into a wider and more consistent operating margin. The margin can be as high as 40%, i.e., the circuit works well with a supply current $I_p$ that is only 60% of the maximum allowed value (i.e., $2I_{c2}$).

In an alternative embodiment of the present invention, tunnel diodes could be used in place of Josephson junctions.

As mentioned above, tunnel diodes and Josephson junction devices have similar I/V characteristics. Therefore it is possible to replace Branch A and/or Branch B with a string of tunnel diodes. The replaced branch would switch to voltage states in similar manner to the Josephson junctions without all of the speed benefits associated with Josephson junction devices.

In the foregoing specification, the invention has been described with reference to specific exemplary embodiments thereof. It will, however, be evident that various modifications and changes may be made thereto without departing from the broader spirit and scope of the invention as set forth in the appended claims. The specification and drawings are, accordingly, to be regarded in an illustrative rather than a restrictive sense.

What is claimed is:

1. An apparatus for generating a step voltage waveform, comprising:
   first means for receiving a switching signal;
   second means, responsive to said switching signal, for producing an intermediate signal switchable between at least a first voltage and a second voltage, said second means including a first path comprising a first plurality of switching devices in series, each of said switching devices being capable of switching between two stable states and said first plurality of switching devices being coupled to a second path comprising a second plurality of switching devices in series, each of said switching devices of said second plurality of switching devices being capable of switching between two stable states, said intermediate signal being at said second voltage when all of said switching devices of said first and second paths have switched from a first one of said stable states to a second one of said stable states; and
   third means, responsive to the switching of the intermediate signal from the said first voltage to the said second voltage, for providing a fast step voltage waveform as an output signal, said third means including a third path of a third plurality of switching devices in series, said third means including means for inhibiting a switching of any of said third plurality of switching devices until said second means attains said second voltage state.

2. The apparatus for generating a step voltage waveform recited in claim 1, wherein said switching devices of said first path are Josephson junction devices.

3. The apparatus for generating a step voltage waveform recited in claim 1 wherein said switching devices of said first path are tunnel diodes.

4. The apparatus for generating a step voltage waveform recited in claim 1 wherein said switching devices of said first and second paths are Josephson junction devices and wherein each of said second plurality of switching devices has substantially the same critical current threshold for switching voltage states.

5. An apparatus for generating a step voltage waveform, comprising:
   first means for receiving a switching signal;
   second means, responsive to said switching signal, for producing an intermediate signal switchable between at least a first voltage and a second voltage, said second means including a first path comprising a first plurality of switching devices in series coupled to a second path comprising a second plurality of switching devices in series;
   third means, responsive to the switching of the intermediate signal from the said first voltage to the said second voltage, for providing a fast step voltage waveform as an output signal said third means including a third path of a third plurality of switching devices in series; and
   fourth means for coupling said second path and said third path and for inhibiting current flow to said third path until said second means has produced an intermediate signal of said second voltage, said fourth means having a high, impedance for high frequency signals.

6. An apparatus for generating a driving signal to a step signal output generator, comprising:
   first means for receiving a trigger signal;
   second means for producing a bias current;
   a first current path, coupled to said first means, and responsive to said trigger signal and a first portion of said bias current, producing a preliminary output of said trigger signal and said first portion of said bias content, said first current path including a plurality of switching devices connected in series;
   a second current path, coupled to said first current path, and responsive to a second portion of said bias current and said preliminary output to produce, with said first current path, a driving signal, said second current path including a second plurality of switching devices connected in series; and
   an element coupled between said second path and said step signal output generator, said element having a high impedance for high frequency signals and inhibiting current flow to said step signal output generator until said first plurality and said second plurality of switching devices have all switched states to produce said driving signal.

7. In a time domain reflectometer comprising a step signal output generator, a means for receiving a trigger signal, and a means for producing a driving signal to said step signal output generator in response to said trigger signal, the improvement comprising:
   said means for producing a driving signal including,
   first means for producing a bias current;
   a first current path coupled to said means for receiving a trigger signal, and responsive to said trigger signal and a first portion of said bias current, producing a preliminary output of said trigger signal and said first portion of said bias current, said first current path including a plurality of switching devices connected in series;
   a second current path, coupled to said first current path, and responsive to a second portion of said bias current and said preliminary output to produce a driving signal, said second current path including a second plurality of switching devices connected in series; and
   an element coupled between said second path and said step signal output generator, said element having a high impedance for high frequency signals and inhibiting a driving signal from flowing to said step signal output generator until all of said first plurality and said second plurality of switches have switched state.

* * * * *